United States Patent
Wen

(10) Patent No.: US 10,170,542 B2
(45) Date of Patent: Jan. 1, 2019

(54) SEMICONDUCTOR DEVICE

(71) Applicant: Nuvoton Technology Corporation, Hsinchu (TW)

(72) Inventor: Wen-Ying Wen, Hsinchu (TW)

(73) Assignee: Nuvoton Technology Corporation, Hsinchu (TW)

( * ) Notice: Subject to any disclaimer, the term of this patent is extended or adjusted under 35 U.S.C. 154(b) by 0 days.

(21) Appl. No.: 15/856,070

(22) Filed: Dec. 28, 2017

(65) Prior Publication Data
US 2018/0190765 A1 Jul. 5, 2018

(30) Foreign Application Priority Data

Dec. 29, 2016 (TW) .............................. 105143811 A

(51) Int. Cl.
*H01L 29/06* (2006.01)
*H01L 29/10* (2006.01)
*H01L 29/78* (2006.01)

(52) U.S. Cl.
CPC ...... *H01L 29/0634* (2013.01); *H01L 29/0653* (2013.01); *H01L 29/1095* (2013.01); *H01L 29/7816* (2013.01)

(58) Field of Classification Search
CPC ............. H01L 29/0634; H01L 29/0653; H01L 29/1095
See application file for complete search history.

(56) References Cited

U.S. PATENT DOCUMENTS

| 2005/0152080 A1* | 7/2005 | Harris | ................... H01L 27/098 |
| | | | 361/56 |
| 2013/0320431 A1* | 12/2013 | Su | ..................... H01L 21/82348 |
| | | | 257/329 |
| 2014/0117415 A1* | 5/2014 | Ma | ..................... H01L 27/0617 |
| | | | 257/262 |
| 2016/0141418 A1 | 5/2016 | Yeh et al. | |

FOREIGN PATENT DOCUMENTS

| TW | 201027890 | 7/2010 |
| TW | 201044558 | 12/2010 |
| TW | 201608699 | 3/2016 |
| TW | 201622150 | 6/2016 |

* cited by examiner

*Primary Examiner* — Douglas M Menz
(74) *Attorney, Agent, or Firm* — JCIPRNET

(57) ABSTRACT

A semiconductor device including a substrate of a first conductivity type, a metal-oxide-semiconductor-field-effect transistor (MOSFET), junction gate field-effect transistors (JFETs), an isolation structure, and a buried layer of a second conductivity type is provided. The MOSFET is located on the substrate and has a first epitaxial layer of the second conductivity type. The JFET is located on the substrate and has a second epitaxial layer of the second conductivity type. The isolation structure is located between the MOSFET and the JFET to separate the first epitaxial layer from the second epitaxial layer. The buried layer is located between the MOSFET and the substrate. The buried layer extends from below the MOSFET to below the isolation structure and below the JFET, so as to electrically connect the MOSFET to the first JFET.

8 Claims, 2 Drawing Sheets

SEMICONDUCTOR DEVICE

CROSS-REFERENCE TO RELATED APPLICATION

This application claims the priority benefit of Taiwan application serial no. 105143811, filed on Dec. 29, 2016. The entirety of the above-mentioned patent application is hereby incorporated by reference herein and made a part of this specification.

FIELD OF THE INVENTION

The invention relates to an integrated circuit. More particularly, the invention relates to a semiconductor device.

DESCRIPTION OF RELATED ART

In recent years, along with the rise of awareness of environmental protection, high voltage devices with low power consumption and high efficiency of energy conversion attract more and more attention. Generally, the high voltage devices are mainly applied in power switch devices, such as in the fields of switching mode power supply (SMPS), illumination, motor control, or plasma display panel drivers.

A diffused metal-oxide semiconductor (DMOS) device is a typical high voltage device. Generally, the DMOS device may be classified into a laterally diffused metal oxide semiconductor (LDMOS) device and a vertical diffused metal-oxide semiconductor (VDMOS) device. The VDMOS device has a smaller area size compared to the LDMOS device, and the smaller size is an advantage in the technology trend of microminiaturization. When operating a VDMOS device, a high breakdown voltage and a low on-state resistance (Ron) must be satisfied. Nevertheless, if a designer intends to meet the specification requirements for the high breakdown voltage, the Ron is usually sacrificed, and vice versa. Hence, the relationship between the high breakdown voltage and the Ron is a trade-off.

SUMMARY OF THE INVENTION

The invention provides a semiconductor device which a metal-oxide-semiconductor field-effect transistor (MOSFET) is connected with junction gate field-effect transistors (JFETs) in series, such that the semiconductor device is equipped with a high breakdown voltage and is able to maintain a low on-state resistance (Ron) at the same time.

In an embodiment of the invention, the semiconductor device includes a substrate of a first conductivity type, the MOSFET, a first JFET, an isolation structure, and a buried layer of a second conductivity type. The MOSFET is located on the substrate and has a first epitaxial layer of the second conductivity type. The first JFET is located on the substrate and has a second epitaxial layer of the second conductivity type. The isolation structure is located between the MOSFET and the first JFET to separate the first epitaxial layer from the second epitaxial layer. The buried layer is located between the MOSFET and the substrate. The buried layer extends from below the MOSFET to below the isolation structure and below the first JFET, so as to electrically connect the MOSFET to the first JFET.

In view of the foregoing, the MOSFET is connected with the JFETs in series through the buried layer below the MOSFET according to the invention. One of the JFETs is located between a drain region and the buried layer. Another one of the JFETs is located between a source region (or a gate structure) and the buried layer. When a drain voltage is low, the Ron of the semiconductor device provided by the embodiments of the invention acts as a linear resistance of the JFETs. But when the drain voltage is high, since a pinch-off effect in the JFETs shares most of the voltage drop, the breakdown voltage of the semiconductor device provided in the embodiments of the invention is increased. It is thus can be seen that the semiconductor device provided in the embodiments of the invention is not only equipped with a high breakdown voltage but also able to maintain a low Ron at the same time.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
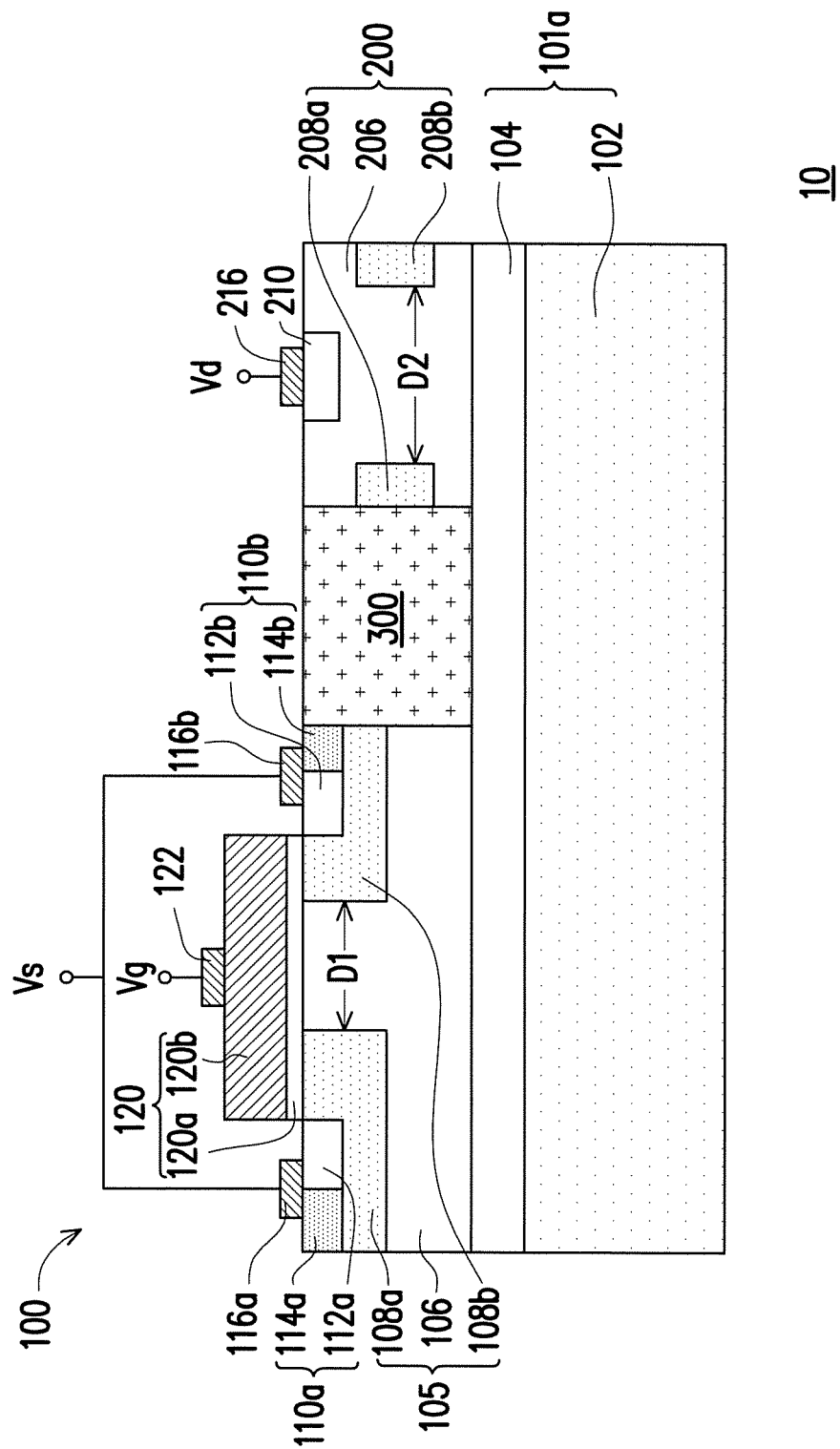
FIG. 1 is a schematic cross-sectional view of a semiconductor device according to the first embodiment of the invention.

Example embodiments will now be described more fully with reference to the accompanying drawings. Example embodiments may, however, be embodied in many different forms and should not be construed as being limited to the embodiments set forth herein. In the drawings, thicknesses of layers and regions are exaggerated for clarity purpose. Wherever possible, the same reference numbers are used in the drawings and the description to refer to the same or like parts. Therefore, detailed description thereof will not be described herein.

In the embodiments of the invention, a first conductivity type and a second conductivity type are different. In an embodiment, the first conductive type is N type, and the second conductive type is P type. In another embodiment, the first conductive type is P type, and the second conductive type is N type. A P-type dopant is boron, for example, and an N-type dopant is phosphorus or arsenic, for example. In the embodiment, the first conductivity type is exemplified as P-type, and the second conductivity type is exemplified as N-type for description. But the invention is not limited thereto.

FIG. 1 is a schematic cross-sectional view of a semiconductor device according to the first embodiment of the invention.

Referring to FIG. 1, a semiconductor device 10 includes a substrate 102 of the first conductivity type, a buried layer 104 of the second conductivity type, a MOSFET 100, a JFET 200, and an isolation structure 300.

Figure 2:
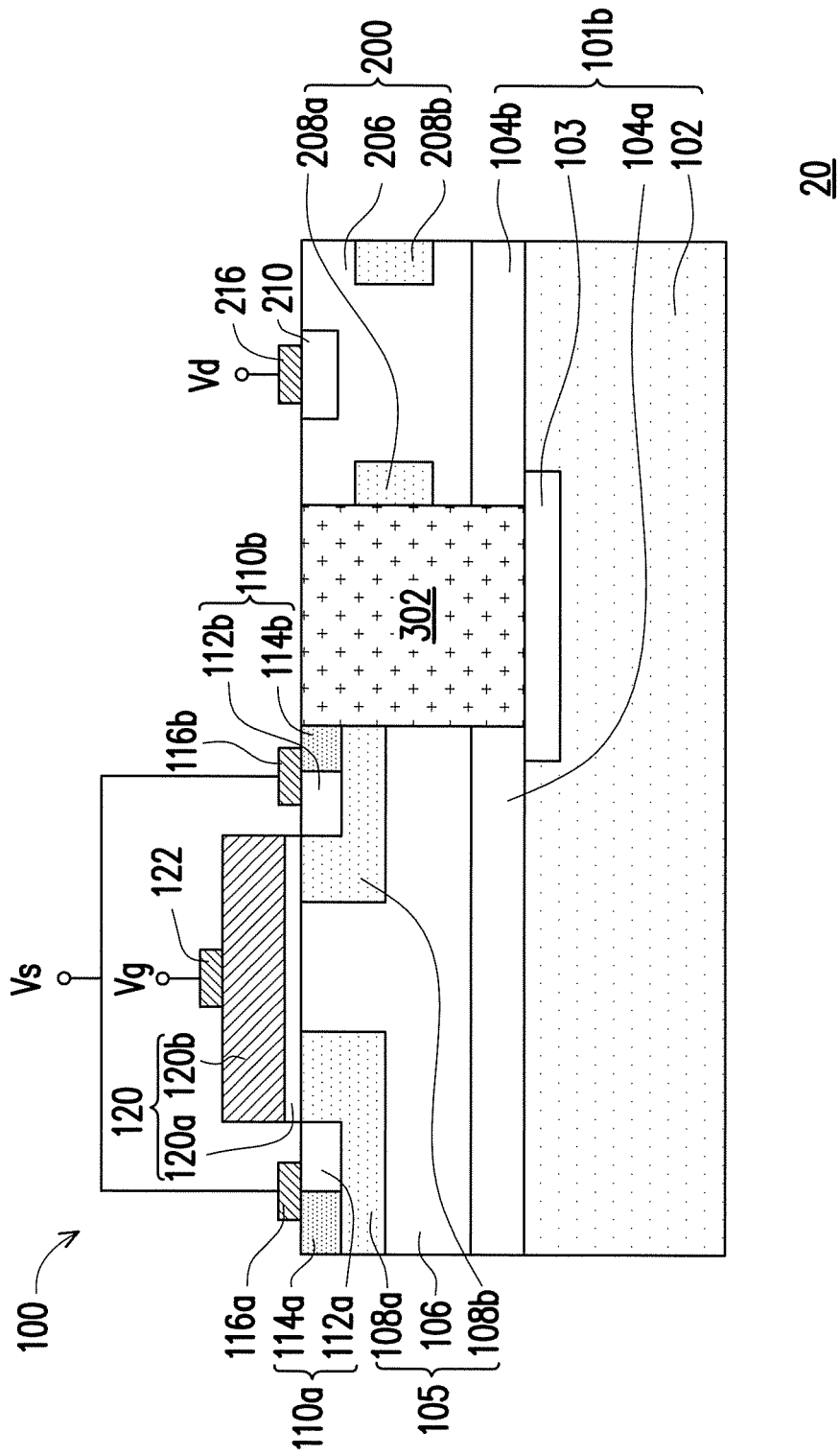
FIG. 2 is a schematic cross-sectional view of a semiconductor device according to the second embodiment of the invention.

The MOSFET 100 and the JFET 200 are located on the substrate 102. Looking from a direction parallel to a top surface of the substrate 102, the isolation structure 300 is located between the MOSFET 100 and the JFET 200. Looking from a direction perpendicular to the top surface of the substrate 102, the buried layer 104 is located between the MOSFET 100 and the JFET 102. The buried layer 104 extends from below the MOSFET 100 to below the isolation structure 300 and below the JFET 200. As shown in FIG. 1, a bottom surface of the MOSFET 100, a bottom surface of the isolation structure 300, and a bottom surface of the JFET 200 are substantially coplanar. But the invention is not limited thereto. In other embodiments, a bottom surface of an isolation structure 302 may be lower than the bottom surface of the MOSET 100 and the bottom surface of the JFET 200 as shown in FIG. 2.

It is worth noting that the MOSFET 100 provided by the embodiment is electrically connected to the JFET 200 or is connected to the JFET 200 in series through the buried layer 104. Hence, when the drain voltage is low, a Ron of the semiconductor device 10 provided by the embodiment acts as a linear resistance of the MOSFET 100 and the JFET 200. But when the drain voltage is high, since a pinch-off effect in the JFET 200 shares most of the voltage drop, a breakdown voltage of the semiconductor device 10 provided by the embodiment is increased. It is thus can be seen that the semiconductor device 10 provided by the embodiment is not only equipped with a high breakdown voltage but also at the same time able to maintain a low Ron.

Specifically, the substrate 102 may be a semiconductor substrate, a semiconductor compound substrate, or a semiconductor over insulator (SOI) substrate. The semiconductor is IVA group atoms, such as silicon or germanium, for example. The semiconductor compound is formed of IVA group atoms, such as silicon carbide or silicon germanium, or formed of IIIA group atoms and VA group atoms, such as gallium arsenide, for example.

The buried layer 104 is located on the substrate 102. In an embodiment, the buried layer 104 may be, for example, an N-buried layer, an N-epi layer, a deep N-well region, or a combination thereof. A doping concentration of the buried layer 104 is $1 \times 10^{18}/cm^3$ to $1 \times 10^{21}/cm^3$. The MOSFET 100 and the JFET 200 may be electrically connected through a low resistance path provided by the buried layer 104.

The MOSFET 100 is located on the buried layer 104, such that the buried layer 104 is located between the MOSFET 100 and the substrate 102. Specifically, the MOSFET 100 includes a first epitaxial layer 106 of the second conductivity type, body regions 108a and 108b of the first conductivity type, source regions 110a and 110b, and a gate structure 120.

The first epitaxial layer 106 is located on the buried layer 104. In an embodiment, a dopant implanted into the first epitaxial layer 106 may be, for example, phosphorus or arsenic, and a doping concentration of the first epitaxial layer 106 is $1 \times 10^{15}/cm^3$ to $1 \times 10^{17}/cm^3$. In an embodiment, the doping concentration of the first epitaxial layer 106 is less than the doping concentration of the buried layer 104.

The body regions 108a and 108b is located in the first epitaxial layer 106. The body regions 108a and 108b are separated from each other and disconnected. In an embodiment, a doping concentration of the body regions 108a and 108b may respectively be, for example, $1 \times 10^{16}/cm^3$ to $1 \times 10^{19}/cm^3$. In an embodiment, the doping concentration of the body region 108a may be equal to the doping concentration of the body region 108b. In an alternative embodiment, the doping concentration of the body region 108a and the doping concentration of the body region 108b may also be different.

The source region 110a is located in the body region 108a, and the source region 110b is located in the body region 108b. The source region 110a and the source region 110b are connected to each other through an interconnection. Particularly, the source region 110a includes a doped region 112a of the second conductivity type and a doped region 114a of the first conductivity type. The source region 110b includes a doped region 112b of the second conductivity type and a doped region 114b of the first conductivity type. The doped regions 112a and 112b are close to the gate structure 120. In an embodiment, doping concentrations of the doped region 114a and 114b are greater than the doping concentrations of the body region 108a and 108b. Doping concentrations of the doped regions 112a and 112b are greater than the doping concentration of the first epitaxial layer 106.

The gate structure 120 includes a gate dielectric layer 120a and a gate electrode 120b. Looking from the direction parallel to the top surface of the substrate 102, the gate structure 120 is located between the doped regions 112a and 112b. Looking from the direction perpendicular to the top surface of the substrate 102, the gate dielectric layer 120a is located between the first epitaxial layer 106 (or the body regions 108a and 108b) and the gate electrode 120b. In other words, a top surface of the first epitaxial layer 106, a portion of a top surface of the body region 108a, and a portion of a top surface of the body region 108b are covered by the gate structure 120. The gate dielectric layer 120a may be constituted by a single material layer. The single material layer is, for example, a low dielectric constant material or a high dielectric constant material. The low dielectric constant material is a dielectric material having a dielectric constant smaller than 4, such as silicon oxide or silicon oxynitride. The high dielectric constant material is a dielectric material having a dielectric constant greater than 4, such as HfAlO, $HfO_2$, $Al_2O_3$, or $Si_3N_4$. A thickness of the gate dielectric layer 120a differs according to choices among different dielectric materials. For example, if the gate dielectric layer 120a is silicon oxide, the thickness of the gate dielectric layer 120a may be 5 nm to 100 nm. The gate electrode 120b is a conductive material, such as metal, undoped polysilicon, doped polysilicon, metal silicide, or a stacking layer combining the foregoing materials.

In the embodiment, a JFET 105 is formed by the body regions 108a and 108b and the first epitaxial layer 106. In other words, when the drain voltage is high, the first epitaxial layer 106 may also be depleted by the JFET 105 provided by the embodiment to achieve a pinch-off effect. Since the pinch-off effect shares most of the voltage drop, the breakdown voltage of the semiconductor device 10 provided by the embodiment is further increased. It is worth noting that the body region 108a is distant from the body region 108b by a distance D1. In an embodiment, the distance D1 may be, for example, 400 nm to 20000 nm. When the distance D1 is too short, the Ron of the semiconductor device 10 provided by the embodiment may be increased. On the contrary, when the distance D1 is too long and the drain voltage is high, a breakdown is easily occurred in the gate dielectric layer 120a, leading to a damage to the semiconductor device 10 as a result.

Furthermore, the JFET 200 includes a second epitaxial layer 206 of the second conductivity type and doped regions 208a and 208b of the first conductivity type.

The second epitaxial layer 206 is located on the buried layer 104. In an embodiment, a dopant implanted into the second epitaxial layer 206 may be, for example, phosphorus or arsenic, and a doping concentration of the second epitaxial layer may be, for example, $1 \times 10^{15}/cm^3$ to $1 \times 10^{17}/cm^3$. In an embodiment, the doping concentration of the second epitaxial layer 206 and the doping concentration of the first epitaxial layer 106 may be substantially identical. But the invention is not limited thereto. In other embodiments, the doping concentration of the second epitaxial layer 206 may be different from the doping concentration of the first epitaxial layer 106.

The doped regions 208a and 208b are respectively located in the second epitaxial layer 206. In an embodiment, the doped regions 208a and 208b may be separated from each other and disconnected. In an alternative embodiment, the doped regions 208a and 208b may be annular-shaped and connected to each other on another cross-section. In an embodiment, a doping concentration of the body regions 208a and 208b may respectively be $1 \times 10^{16}/cm^3$ to $1 \times 10^{19}/cm^3$. The doped regions 208a and 208b may be formed, for example, by following steps. A mask layer (not shown) is formed on the second epitaxial layer 206 after the second epitaxial layer 206 is formed. Regions to be formed as the dope regions 208a and 208b are exposed by the mask layer (not shown). Afterwards, an ion implantation process is performed on the second epitaxial layer 206, so that the doped regions 208a and 208b are respectively formed in the second epitaxial layer 206. The doped regions 208a and 208b are separated by a distance D2. In an embodiment, the distance D2 may be, for example, 5 µm to 20 µm. But the invention is not limited thereto. In other embodiments, a length of the distance D2 may be adjusted according to requirements from the designer.

The semiconductor device 10 provided by the embodiment may further includes a doped region 210 of the second conductivity type. The doped region 210 is located in the second epitaxial layer 206 between the doped regions 208a and 208b. Specifically, the doped region 210 is located on an upper portion of the second epitaxial layer 206. A top surface of the doped region 210 and a top surface of the second epitaxial layer 206 are substantially coplanar. The doped region 210 and the doped regions 208a and 208b are separated from one another and disconnected. In an embodiment, a doping concentration of the doped region 210 is $1 \times 10^{19}/cm^3$ to $1 \times 10^{21}/cm^3$. In an embodiment, the doped region 210 may be viewed as the drain region of the MOSFET 100.

In addition, the semiconductor device 10 further includes contacts 116a, 116b, 122, and 216. The contact 116a is located on the source region 110a, the contact 116b is located on the source region 110b, the contact 122 is located on the gate structure 120, and the contact 216 is located on the doped region 210 (e.g., the drain region). The contacts 116a, 116b, and 216 are respectively conductive materials, such as, metal, undoped polysilicon, doped polysilicon, metal silicide, or a combination thereof.

In an embodiment, the MOSFET 100 may be viewed as the DMOS device, and the JFET 105 and the JFET 200 may be viewed as vertical JFETs. During an operation, when a drain voltage Vd, a gate voltage Vg, and a grounding voltage Vs are respectively applied to the contact 216, the contact 122, and the contacts 116a and 116b, the drain voltage Vd may be applied to the first epitaxial layer 106 through a low resistance path formed by the second epitaxial layer 206 and the buried layer 104. Next, a channel is formed on top surfaces of the body regions 108a and 108b below the gate structure 120 to activate the MOSFET 100. Hence, when the MOSFET 100 is activated (i.e., when the drain voltage is low), the Ron of the semiconductor device 10 may be viewed as a sum of resistance of the first epitaxial layer 106 and the second epitaxial layer 206. On the other hand, when the MOSFET 100 is deactivated (i.e., when the drain voltage is high), since the pinch-off effects in the JFET 105 and JFET 200 share most of the voltage drop, the breakdown voltage of the semiconductor device 10 provided by the embodiment is increased.

In addition, the semiconductor device 10 provided by the embodiment includes the isolation structure 300. The isolation structure 300 is located between MOSFET 100 and the JFET 200. The isolation structure 300 may be configured to separate the first epitaxial layer 106 and the doped region 210 (or the second epitaxial layer 206), so that a current is guided to flow in a vertical direction (i.e., a direction of flowing through the second epitaxial layer 206 and the buried layer 104) to the first epitaxial layer 106, and the breakdown voltage of the semiconductor device 10 provided by the embodiment is thereby increased. In an embodiment, the isolation structure 300 may be, for example, a shallow trench isolation (STI) structure, and the isolation structure 300 includes an insulating material. The insulating material may be silicon oxide, silicon nitride, or combination thereof.

In addition, the substrate 102 of the first conductivity type and the buried layer 104 may be viewed as a diode 101a as shown in FIG. 1. The diode 101a and the MOSFET 100 are connected in parallel.

FIG. 2 is a schematic cross-sectional view of a semiconductor device according to the second embodiment of the invention.

Referring to FIG. 2, a semiconductor device 20 provided by the second embodiment of the invention is similar to the semiconductor device 10 provided by the first embodiment. Nevertheless, a difference therebetween is that the buried layer is penetrated by the isolation structure 302 of the semiconductor device 20 provided by the second embodiment, and that the buried layer is divided into two buried structures 104a and 104b. The buried structure 104a is located between the MOSFET 100 and the substrate 102, and the buried structure 104b is located between the JFET 200 and the substrate 102. Although the buried layer is completely penetrated by the isolation structure 302 as shown in FIG. 2, and that the isolation structure 302 is disposed between the buried structures 104a and 104b, the invention is not limited thereto. The scope of the invention covers that in other embodiments, the isolation structure 302 only have to be partially embedded in the buried layer (i.e., the buried layer is not completely penetrated by the isolation structure 302). In other words, the bottom surface of the isolation structure 302 may be lower than top surfaces of the buried structures 104a and 104b, and the bottom surface of the isolation structure 302 may be higher than, equal to, or lower than bottom surfaces of the buried structures 104a and 104b.

In addition, the semiconductor device 20 provided by the second embodiment further includes a doped region 103 of the second conductivity type. The doped region 103 is located in the substrate 102 below the isolation structure 302. The doped region 103 extends from below the isolation structure 302 to below the buried structures 104a and 105b, respectively, so that the doped region 103 is in contact with the buried structures 104a and 104b. In other words, the drain voltage Vd may be applied to the first epitaxial layer 106 through a low resistance path formed by the second epitaxial layer 206, the buried structure 104b, and doped region 103, and the buried structure 104b. In an embodiment, the substrate 102 of the first conductivity type, the buried structure 104b, the doped region 103, and the buried structure 104b may also be viewed as a diode 101b. The diode 101b and the MOSFET 100 are connected in parallel.

In view of the foregoing, the MOSFET is connected with the JFETs in series through the buried layer below the MOSFET according to the invention. One of the JFETs is located between the drain region and the buried layer. Another one of the JFETs is located between the source region (or the gate structure) and the buried layer. When a drain voltage is low, the Ron of the semiconductor device provided by the embodiments of the invention acts as the linear resistance of the JFETs. But when the drain voltage is high, since the pinch-off effect in the JFETs shares most of the voltage drop, the breakdown voltage of the semiconductor device provided by the embodiments of the invention is increased. It is thus can be seen that the semiconductor device provided by the embodiments of the invention is not only equipped with a high breakdown voltage but also able to maintain a low Ron at the same time.

It will be apparent to those skilled in the art that various modifications and variations can be made to the disclosed embodiments without departing from the scope or spirit of the invention. In view of the foregoing, it is intended that the invention covers modifications and variations provided that they fall within the scope of the following claims and their equivalents.

What is claimed is:

1. A semiconductor device, comprising:
   a substrate of a first conductivity type;
   a metal-oxide-semiconductor-field-effect transistor (MOSFET), located on the substrate, wherein the MOSFET comprises:
     a first epitaxial layer of a second conductivity type;
     at least two body regions of the first conductivity type, respectively located in the first epitaxial layer;
     at least two first doped regions of the second conductivity type, respectively located in the body regions; and
     a gate structure, located on the first epitaxial layer between the first doped regions;
   a first junction gate field-effect transistor (JFET), located on the substrate, the first JFET having a second epitaxial layer of the second conductivity type;
   an isolation structure, located between the MOSFET and the first JFET to separate the first epitaxial layer from the second epitaxial layer; and
   a buried layer of the second conductivity type, located between the MOSFET and the substrate, wherein the buried layer extends from below the MOSFET to below the isolation structure and below the first JFET, so as to electrically connect the MOSFET to the first JFET.

2. The semiconductor device as claimed in claim 1, wherein a second JFET is formed by the body regions and the first epitaxial layer.

3. The semiconductor device as claimed in claim 1, wherein the body regions are separated by a distance, and the distance falls between 400 nm to 20000 nm.

4. The semiconductor device as claimed in claim 1, wherein the first JFET comprises:
   at least two second doped regions of the first conductivity type, respectively located in the second epitaxial layer.

5. The semiconductor device as claimed in claim 4, further comprising a third doped region of the second conductivity type, located in the second epitaxial layer between the second doped regions, wherein the second doped regions and the third doped regions are not connected to one another.

6. The semiconductor device as claimed in claim 1, wherein a diode is formed by the substrate and the buried layer, and the diode and the MOSFET are connected in parallel.

7. The semiconductor device as claimed in claim 1, wherein the isolation structure penetrates through the buried layer for dividing the buried layer into two buried structures, and the buried structures are respectively located between the MOSFET and the substrate and between the first JFET and the substrate.

8. The semiconductor device as claimed in claim 7, further comprising a fourth doped region of the second conductivity type, located in the substrate below the isolation structure, wherein the fourth doped region is in contact with the buried structures.

* * * * *